United States Patent
Ishibashi et al.

(10) Patent No.: US 10,923,346 B2
(45) Date of Patent: Feb. 16, 2021

(54) GROUP III NITRIDE SEMICONDUCTOR AND METHOD FOR PRODUCING SAME

(71) Applicant: Panasonic Intellectual Property Management Co., Ltd., Osaka (JP)

(72) Inventors: Akihiko Ishibashi, Osaka (JP); Hiroshi Ono, Osaka (JP); Kenya Yamashita, Hyogo (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 0 days.

(21) Appl. No.: 16/562,684

(22) Filed: Sep. 6, 2019

(65) Prior Publication Data
US 2020/0135447 A1 Apr. 30, 2020

(30) Foreign Application Priority Data
Oct. 29, 2018 (JP) .................................. 2018-203008

(51) Int. Cl.
| | |
|---|---|
| *H01L 21/02* | (2006.01) |
| *C30B 29/22* | (2006.01) |
| *H01L 29/20* | (2006.01) |
| *H01L 21/3063* | (2006.01) |
| *C30B 25/18* | (2006.01) |

(52) U.S. Cl.
CPC ........ *H01L 21/0254* (2013.01); *C30B 25/183* (2013.01); *C30B 29/22* (2013.01); *H01L 21/02389* (2013.01); *H01L 21/02458* (2013.01); *H01L 21/02543* (2013.01);
(Continued)

(58) Field of Classification Search
None
See application file for complete search history.

(56) References Cited

U.S. PATENT DOCUMENTS

| | | | |
|---|---|---|---|
| 2013/0244364 A1* | 9/2013 | Gardner | ............... C30B 25/183 438/47 |
| 2014/0048817 A1* | 2/2014 | Gardner | ................. H01L 33/02 257/76 |

(Continued)

OTHER PUBLICATIONS

Jianqi Liu et al, "A Practical Route Towards Fabricating GaN Nanowire Arrays", Crystal Engineering Communication, (2011), No. 13, pp. 5929-5935.

Primary Examiner — Steven M Christopher
(74) Attorney, Agent, or Firm — Wenderoth, Lind & Ponack, L.L.P.

(57) ABSTRACT

A Group III nitride semiconductor for growing a high-quality crystal having a low defect density and a method for producing the Group III nitride semiconductor. The Group III nitride semiconductor includes an $RAMO_4$ substrate including a single crystal represented by the general formula $RAMO_4$ (where R represents one or more trivalent elements selected from the group consisting of Sc, In, Y and lanthanoid elements, A represents one or more trivalent elements selected from the group consisting of Fe(III), Ga and Al, and M represents one or more divalent elements selected from the group consisting of Mg, Mn, Fe(II), Co, Cu, Zn and Cd); a p-type Group III nitride crystal layer disposed on the $RAMO_4$ substrate; a plurality of n-type Group III nitride crystal layers disposed on the p-type Group III nitride crystal layer; and a Group III nitride crystal layer disposed on the n-type Group III nitride crystal layers.

4 Claims, 4 Drawing Sheets

(52) U.S. Cl.
CPC .. *H01L 21/02579* (2013.01); *H01L 21/30635* (2013.01); *H01L 29/2003* (2013.01)

(56) References Cited

U.S. PATENT DOCUMENTS

2017/0279003 A1\* 9/2017 Ishibashi ............. H01L 21/0262
2018/0174911 A1\* 6/2018 Komatsu ............. H01L 21/0242

\* cited by examiner

GROUP III NITRIDE SEMICONDUCTOR AND METHOD FOR PRODUCING SAME

CROSS REFERENCE TO RELATED APPLICATIONS

This application is entitled to and claims the benefit of Japanese Patent Application No. 2018-203008, filed on Oct. 29, 2018, the disclosure of which including the specification, drawings and abstract is incorporated herein by reference in its entirety.

TECHNICAL FIELD

The present disclosure relates to a Group III nitride semiconductor, and a method for producing the Group III nitride semiconductor.

BACKGROUND ART

A method has been disclosed, in which a Group III nitride semiconductor is selectively grown using a substrate heterogeneous to the Group III nitride semiconductor, nanowires of the Group III nitride semiconductor are then formed, and the Group III nitride semiconductor is further crystal-grown on the nanowires to reduce the number of threading dislocation defects (hereinafter, also referred to as "dislocations") in the Group III nitride semiconductor (Crystal Engineering Communication (2011), No. 13, pp. 5929-5935).

For example, as shown in FIG. 4, thin n-type GaN layer 402 having thickness of several μm is crystal-grown on sapphire substrate 401 by metal organic chemical vapor deposition method (hereinafter, also referred to as "MOCVD method"). Subsequently, thick n-type GaN layer 403 having thickness of about 30 μm is crystal-grown by hydride vapor phase epitaxy method (hereinafter, also referred to as "HVPE method"). Thereafter, using a $KOH:K_2S_2O_8$ electrolytic liquid, wet etching is performed while a surface of the thick n-type GaN layer is irradiated with ultraviolet light by ultraviolet lamp (photo-electro-chemical etching method, hereinafter, also referred to as "PEC method").

When PEC method is carried out, peripheral portions of dislocations caused by lattice mismatching and thermal expansion mismatching between sapphire substrate 401 and thin n-type GaN layer 402 and/or thick n-type GaN layer 403 are selectively etched away. Regions having a small number of dislocations remain in a wire-like shape without being etched, and n-type GaN nanowire layer 404 is formed. In n-type GaN nanowire layer 404, there is substantially no stress in region 406 which is several tens of μm away from an interface between sapphire substrate 401 and thin n-type GaN layer 402. Subsequently, thick GaN layer 405 is formed on n-type GaN nanowire layer 404 by HVPE method, and consequently, a GaN layer is grown from the top portion of n-type GaN nanowire layer 404 having small stress and a small number of dislocations, so that thick GaN layer 405 having a small number of dislocations can be formed.

SUMMARY OF INVENTION

Technical Problem

However, when nanowires of n-type GaN are formed on a sapphire substrate using PEC method as in Crystal Engineering Communication (2011), No. 13 above, there arises the problem that the etching depth is not uniform, and thus the nanowires have uneven heights. When the nanowires have uneven heights, dislocation density of a GaN layer on the nanowires tends to be uneven and a large penetration pit tends to be generated in a GaN layer on the nanowires, which are considered problematic in preparation of a GaN crystal having large diameter.

The present disclosure solves the above-described problems in conventional techniques, and the present invention aims to provide a Group III nitride semiconductor having a low defect density, high quality and a large diameter, and a method for producing the Group III nitride semiconductor.

Solution to Problem

In order to achieve the above object, the present disclosure provides a Group III nitride semiconductor, including an $RAMO_4$ substrate including a single crystal represented by the general formula $RAMO_4$ (where R represents one or more trivalent elements selected from the group consisting of Sc, In, Y and lanthanoid elements, A represents one or more trivalent elements selected from the group consisting of Fe(III), Ga and Al, and M represents one or more divalent elements selected from the group consisting of Mg, Mn, Fe(II), Co, Cu, Zn and Cd); a p-type Group III nitride crystal layer disposed on the $RAMO_4$ substrate; a plurality of n-type Group III nitride crystal layers disposed on the p-type Group III nitride crystal layer and separated from one another; and a Group III nitride crystal layer disposed on the plurality of n-type Group III nitride crystal layers.

Advantageous Effects of Invention

According to the present disclosure, a Group III nitride semiconductor having high quality and a large diameter can be provided.

DESCRIPTION OF EMBODIMENTS

Figure 1:
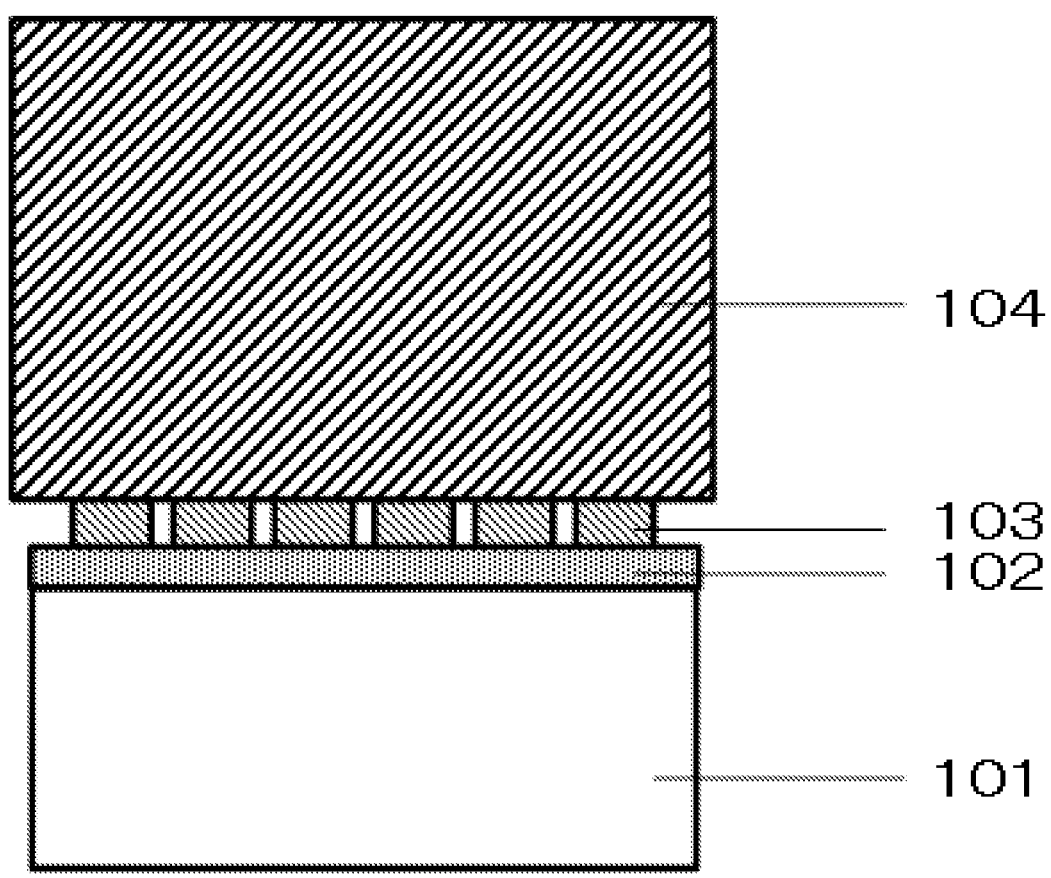
FIG. 1 is a schematic sectional view of a Group III nitride semiconductor according to one embodiment of the present disclosure.

Hereinafter, Embodiments of the present disclosure will be described, referring to the drawings.

Embodiments

FIG. 1 is a schematic sectional view of a Group III nitride semiconductor according to Embodiment of the present disclosure. The Group III nitride semiconductor includes $RAMO_4$ substrate 101 including a single crystal represented by the general formula $RAMO_4$ (where R represents one or more trivalent elements selected from the group consisting of Sc, In, Y and lanthanoid elements, A represents one or more trivalent elements selected from the group consisting of Fe(III), Ga and Al, M represents one or more divalent elements selected from the group consisting of Mg, Mn, Fe(II), Co, Cu, Zn and Cd, and O represents oxygen); p-type Group III nitride crystal layer 102 disposed on RAMO$_4$ substrate 101; a plurality of n-type Group III nitride crystal layers 103 disposed on p-type Group III nitride crystal layer 102 and separated from one another; and Group III nitride crystal layer 104 disposed on a plurality of n-type Group III nitride crystal layers 103. The Group III nitride semiconductor can provide a high-quality Group III nitride semiconductor having a low defect density.

Figure 2A:
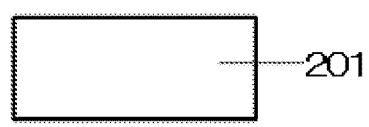
FIGS. 2A to 2G are sectional views of production process of a Group III nitride semiconductor according to one embodiment of the present disclosure.

Next, FIGS. 2A to 2G illustrate production process, in sectional views, of a Group III nitride semiconductor according to the present disclosure. First, as shown in FIG. 2A, RAMO$_4$ substrate 201 for crystal-growth of a Group III nitride semiconductor is prepared. RAMO$_4$ substrate 201 includes a substantially single crystal of a compound represented by the general formula RAMO$_4$. The substantially single crystal material refers to a crystalline solid in which RAMO$_4$ constituting an epitaxial growth surface is contained in an amount of 90 at % or more, and with respect to an arbitrary crystal axis, the direction of the crystal axis is the same at every part of the epitaxial growth surface. A crystal in which the direction of the crystal axis is locally varied, or a crystal which includes localized lattice defects is also considered as a single crystal. Among compounds represented by the general formula RAMO$_4$, one having Sc as R, Al as A and Mg as M is desirable. The Group III element metal constituting a Group III nitride to be grown on the RAMO$_4$ substrate is especially preferably gallium (Ga), but may be, for example, aluminum (Al), indium (In) or thallium (Tl). In the description below, a case where R is Sc, A is Al and M is Mg, that is, a case where RAMO$_4$ substrate 201 is a ScAlMgO$_4$ single crystal substrate, is taken as an example. Further, a case where the Group III nitride crystal is GaN is taken as an example. The present Embodiment is not limited thereto.

Figure 2B:
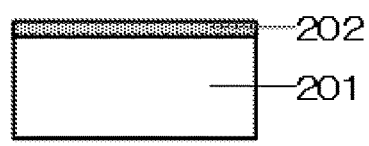
Figure 2C:
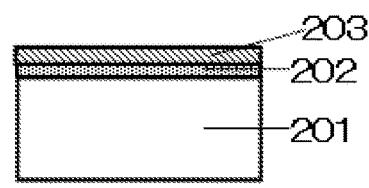

As shown in FIG. 2B, p-type GaN layer 202 having a thickness of, for example, 2.7 μm is formed on ScAlMgO$_4$ substrate 201 by MOCVD method. Subsequently, Si-doped n-type GaN layer 203 having thickness of, for example, 3.3 μm is stacked. In etching by PEC method as described later, a defect-free flat region, of n-type GaN layer 203, can be partially removed. Thus, it is preferable to form n-type GaN layer 203 thicker than p-type GaN layer 202.

MOCVD crystal growth (formation of p-type GaN layer 202 and n-type GaN layer 203) can be performed in the following manner. First, ScAlMgO$_4$ substrate 201 is subjected to thermal annealing for 10 minutes in mixed atmosphere of hydrogen and nitrogen at normal pressure. Thereafter, the atmosphere is cooled to 500° C. Ammonia (NH$_3$) is added to the atmosphere, and trimethyl gallium (TMGa) which is a Ga raw material is then supplied to grow a low-temperature GaN buffer layer having thickness of, for example, 30 nm (not shown). Next, the substrate is heated in ammonia, hydrogen and nitrogen carrier gas to 1,125° C. (during which the growth is pended), and p-type GaN layer 202 and n-type GaN layer 203 are then sequentially grown.

A method for forming p-type GaN layer 202 is now described. In this Embodiment, intentional doping is not performed in MOCVD growth for formation of p-type GaN layer 202. TMGa which is a Ga raw material, and NH$_3$ are supplied in hydrogen and nitrogen carrier gas to grow the layer in vapor phase in atmosphere at normal pressure. During the vapor phase growth, Mg atoms are thermally diffused from ScAlMgO$_4$ substrate 201, and diffused in solid phase to p-type GaN layer 202. This means that the layer is doped with Mg atoms as a p-type dopant.

Figure 3:
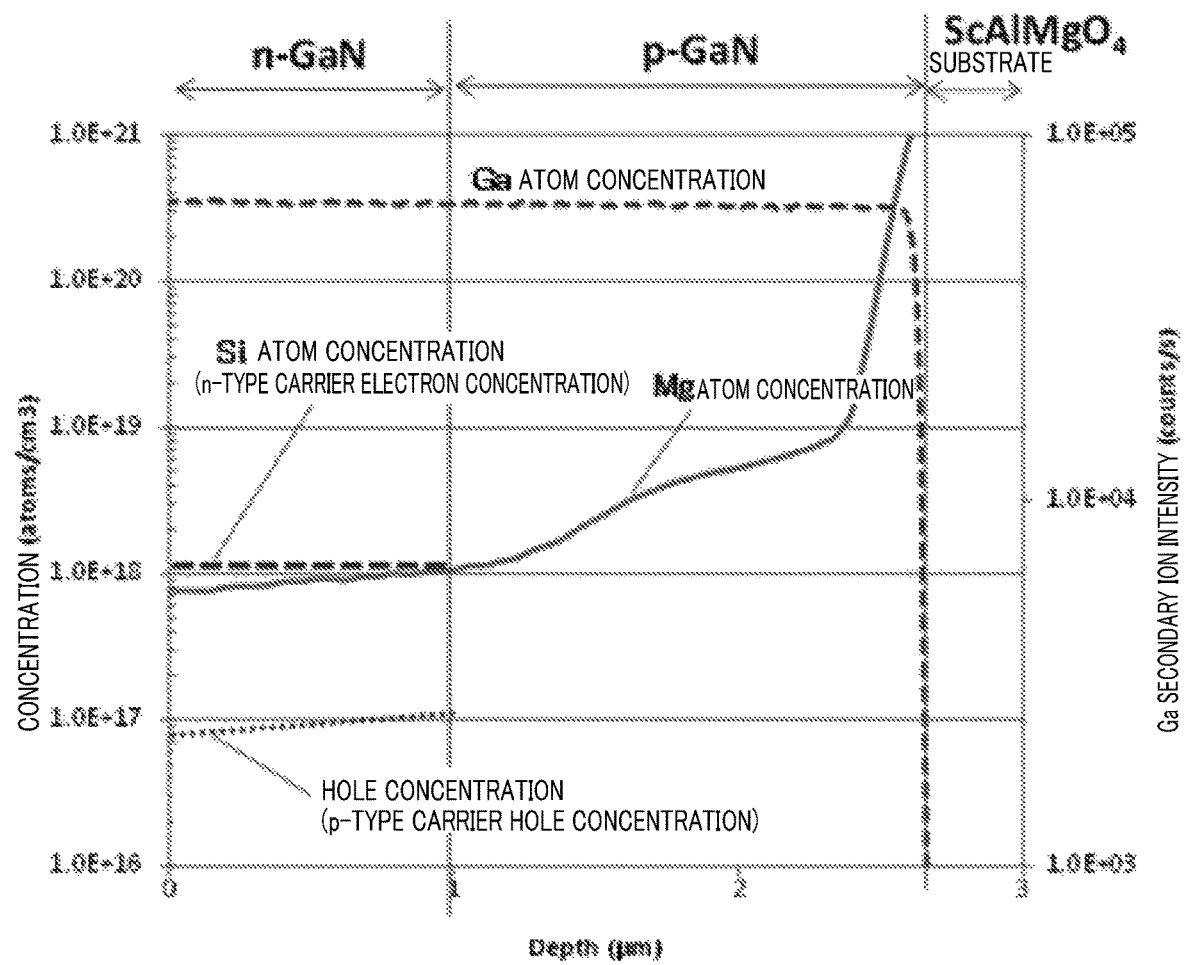
FIG. 3 is a diagram illustrating an atom concentration profile of a Group III nitride semiconductor according to one embodiment of the present disclosure.
Figure 4:
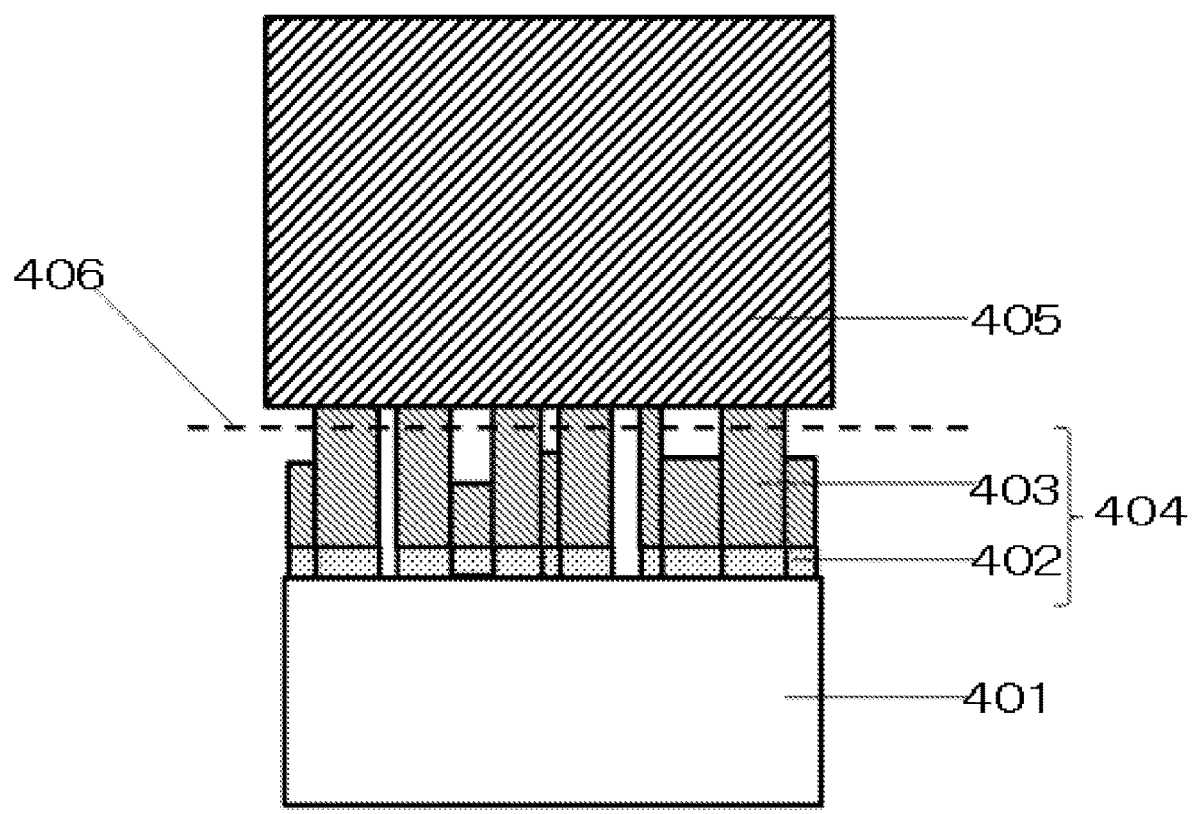
FIG. 4 is a sectional view of a Group III nitride semiconductor produced by a conventional method.

A shown in atom concentration profile of FIG. 3, the concentration of Mg atoms in p-type GaN layer 202 is the highest (about $1\times10^{21}$ cm$^{-3}$) at an interface between p-type GaN layer 202 and ScAlMgO$_4$ substrate 201, and decreases as being distant from the interface to about $1\times10^{18}$ cm$^{-3}$. The atom concentration profile is obtained by secondary ion mass spectrometry (SIMS).

Doping may be performed by supplying a Mg raw material during MOCVD vapor phase growth (during formation of p-type GaN layer 202). In this case, doping delays, which makes it difficult to steeply dope a thin film having an interface thickness of several at high concentration. Further, when the layer is doped with Mg at high concentration during MOCVD vapor phase growth in the vicinity of a substrate (ScAlMgO$_4$ substrate 201) heterogeneous to GaN, improvement of crystallinity such as restoration of dislocations cannot be performed, and thus only low-quality p-type GaN layer 202 can be obtained. Therefore, even when nanowires are formed on p-type GaN layer 202, it is difficult to form high-quality nanowires, and hence it may be impossible to form high-quality GaN layer 205 thereon. Therefore, a method including diffusing Mg in solid phase from ScAlMgO$_4$ substrate 201 as described above is extremely effective for forming high-quality p-type GaN layer 202 at an interface with a heterogeneous substrate.

On the other hand, in growth of n-type GaN layer 203, monodichlorosilane (SiH$_2$Cl$_2$) gas is supplied as a dopant raw material. The concentration of Si atoms in n-type GaN layer 203 is preferably $1\times10^{18}$ cm$^{-3}$ or more and $5\times10^{18}$ cm$^{-3}$ or less. When the Si concentration is above such a range, crystallinity is deteriorated due to roughness of morphology or the like. Further, when the Si concentration is less than $1\times10^{18}$ cm$^{-3}$, hole carriers supplied from Mg diffused in sold phase prevent n-type GaN layer 203 from exhibiting n-type conductivity.

In general, the acceptor impurity level of Mg in GaN is at great depth, and the activity ratio (hole concentration/Mg atom concentration) is about 10%. As shown in FIG. 3, the Mg atom concentration is about $1\times10^{18}$ cm$^{-3}$ and the hole concentration is about $1\times10^{17}$ cm$^{-3}$ at a boundary zone between n-type GaN layer 203 and p-type GaN layer 202. That is, the hole concentration is lower than the Si concentration (about $1\times10^{18}$ cm$^{-3}$) by about 1 digit. Thus, n-type GaN layer 203 exhibits n-type conductivity. It can be considered that the donor impurity level of Si atoms in the GaN is at low depth, and the activity ratio is substantially 100% (Si atom concentration=electron carrier concentration).

The conductivity of p-type GaN layer 202 and n-type GaN layer 203 can be determined by performing SIMS measurement of each of the concentrations of Mg atoms and Si atoms, but for example, a cross-section of a sample may be directly observed by a scanning capacitance microscope method (SCM method).

Figure 2D:
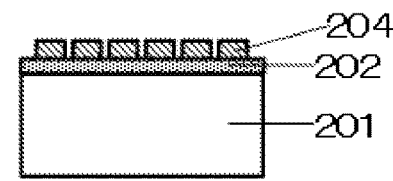
Figure 2E:
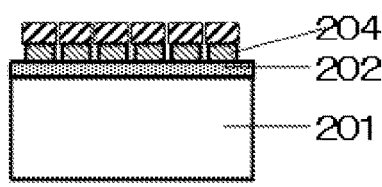

Next, n-type GaN layer 203 is etched using PEC method. Specifically, n-type GaN layer 203 is subjected to wet etching using a KOH:K$_2$S$_2$O$_8$ electrolytic liquid while a surface of the n-type GaN layer is irradiated with ultraviolet ray by an ultraviolet lamp. Resultantly, as shown in FIG. 2D, peripheral portions of dislocations in n-type GaN layer 203 are preferentially etched, and portions having a small number of dislocations and good quality remains as a plurality of n-type GaN nanowire layers 204, having wire-like shape, separated from one another. The diameter of each wire constituting n-type GaN nanowire layer 204 is at this point about several hundreds of μm, and the height of the wire is about 2 μm. In PEC method, a known etchant and ultraviolet irradiation lamp can be used. A mixture of KOH at concentration of 0.5 M and $K_2S_2O_8$ at concentration of 0.1 M can be used as an etchant, and a Xe lamp can be used as an ultraviolet irradiation lamp.

When a structure is used in which n-type GaN layer 203 is stacked on p-type GaN layer 202 as in this Embodiment, only peripheral portions of dislocations in n-type GaN layer 203 are removed by etching using PEC method, and etching is stopped at an interface between n-type GaN layer 203 and p-type GaN layer 202. It is known that in etching of GaN using PEC method, holes, of electron-hole pairs photoexcited by ultraviolet light irradiation using a Xe lamp, are collected on the surface of GaN, which leads to GaN being etched and dissolved. When GaN has n-type conductivity, holes of photoexcited electron-hole pairs can move to the surface side due to curving of bandgaps on a crystal surface. However, when GaN has p-type conductivity, such movement cannot be performed, and GaN is not etched no matter how much ultraviolet light is applied.

Therefore, high-quality p-type GaN layer 202 is formed on the $ScAlMgO_4$ substrate 201 side as in this Embodiment, which makes it possible to stop etching by PEC method accurately and uniformly at an interface between n-type GaN layer 203 and p-type GaN layer 202. Thus, a plurality of n-type GaN nanowire layers 204 having uniform heights and being separated from one another can be formed.

As described above, in conventional methods, nanowires are easily varied in height when etching is performed using PEC method. Such variations in height of nanowires may cause uneven distribution of dislocation density of a GaN layer formed on the nanowires. A large penetration pit may be generated due to, for example, growth abnormality resulting from a localized stress distribution, which raises a problem particularly in preparation of a self-supported GaN substrate having good quality and a large diameter of, for example, 2 inches to 6 inches. On the other hand, such a problem can be solved by equalizing the heights of n-type GaN nanowire layers 204 as in this Embodiment.

Figure 2F:
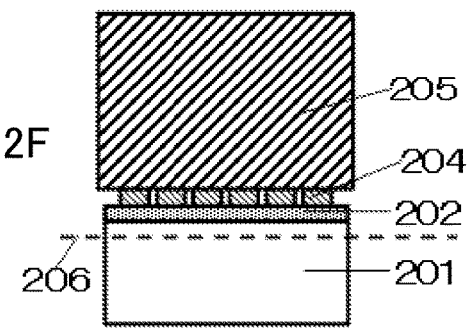

After formation of a plurality of n-type GaN nanowire layers 204, GaN layer 205 is crystal-grown on n-type GaN nanowire layers 204 by MOCVD method or HVPE method. In the early stage of growth, GaN is grown only on the top of each n-type GaN nanowire layer 204 (FIG. 2E); however as growth is continued, these GaNs are grown in a lateral direction and bond together to form integrated GaN layer 205 as shown in FIG. 2F. GaN layer 205 may be doped with Si from the early stage, or from the middle.

Figure 2G:
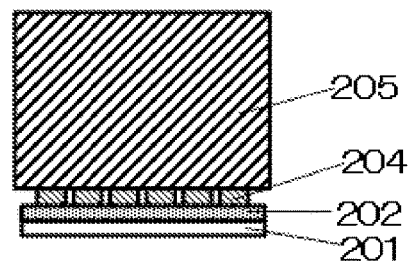

In crystal growth of GaN layer 205, MOCVD method is mainly used when it is desired to obtain a thin template having thickness of about several μm, and only HVPE method, a combination of MOCVD method and HVPE method, or the like is used when GaN layer 205 is thickly grown to thickness of about several hundreds of μm to several mm to be self-supported. When GaN layer 205 is thickened to be self-supported, it is possible to take advantage of the cleavage property of $ScAlMgO_4$ substrate 201. That is, during cooling in HVPE vapor phase growth, thermal stress generated between $ScAlMgO_4$ and GaN causes cleavage in $ScAlMgO_4$ substrate 201 (region (cleavage position 206) extremely close to an interface with p-type GaN layer 202) (FIG. 2F). When a self-supported substrate is prepared for preparation of a device, the surface and the back surface of a stack shown in FIG. 2G are ground and polished to finish a substrate for epitaxial growth. When GaN layer 205 has a large thickness of several mm, the layer can be sliced to prepare a plurality of GaN self-supported substrates.

Here, a Group III nitride semiconductor was actually prepared by the method described in this Embodiment, the dislocation density of GaN layer 205 obtained was about 5 to $10\times10^6$ $cm^{-2}$ on average for a MOCVD-grown thin film (thickness: about 5 μm), and was reduced to about 5 to $10\times10^5$ $cm^{-2}$ on average for a thick film (thickness: 1 mm or more) HVPE-grown on the thin film. At this time, the diameter of $ScAlMgO_4$ substrate 201 was 2 inches, but the same effect can be obtained even when the diameter is 4 inches to 6 inches.

The dislocation density of the surface of n-type GaN layer 203 was about 3 to $10\times10^7$ $cm^{-2}$. As long as there is no difference in thickness, this value is about one-fifth to one-tenth of the dislocation density of GaN on a sapphire substrate that is normally used. The dislocation density was measured by calculating a dark point density in cathode luminescence method (CL method).

In this Embodiment, another effect can be exhibited by preparing p-type GaN layer 202 on $ScAlMgO_4$ substrate 201 by means of diffusion of Mg in a solid phase. When Mg atoms are mixed in a GaN crystal to the degree described above, the lattice constant of the crystal increases. Lattice mismatching of a $ScAlMgO_4$ substrate and a GaN crystal is smaller as compared to a sapphire substrate that is generally used, but the $ScAlMgO_4$ substrate has a lattice constant larger than that of the GaN crystal by about 1.8%. Thus, when Mg at high concentration of about $1\times10^{21}$ $cm^{-3}$ is diffused in solid phase to an interface with p-type GaN layer 202 on the $ScAlMgO_4$ substrate 201 side without deteriorating crystal quality as in this Embodiment, the lattice constant of GaN can be made large and close to the lattice constant of the $ScAlMgO_4$ substrate. Resultantly, distortion of p-type GaN layer 202 and n-type GaN layer 203 is reduced, leading to high-quality nanowires having higher uniformity.

In a method for forming GaN nanowires on a sapphire substrate as described in "Background Art" above, in order to reduce stress on GaN nanowires, after an early-stage n-type GaN layer is formed on a sapphire substrate by MOCVD method, a thick n-type GaN layer having thickness of about 20 to 30 μm is formed by HVPE method higher in growth rate than MOCVD growth by 1 to 2 digits, and then etching is performed by PEC method to form nanowires. That is, it is necessary to carry out two vapor phase growth methods of different modes. On the other hand, in this Embodiment, since a p-type GaN layer is formed on a $ScAlMgO_4$ substrate, etching using PEC method can be stopped. That is, even when the p-type GaN layer and the n-type GaN layer are thin GaN layers, etching using PEC method can be sufficiently controlled. Further, the $ScAlMgO_4$ substrate can be partially removed by means of thermal stress between GaN and the $ScAlMgO_4$ substrate, and thereby GaN layer 205 can be self-supported. Further, since it is possible to form n-type GaN nanowire layer 204 by carrying out MOCVD growth once, productivity can be considerably improved.

In this Embodiment, although HVPE method has been disclosed as a method for growing a GaN crystal into a thick film, the same effect can be obtained by oxide vapor phase epitaxy method (OVPE method).

Further, it has been stated that p-type GaN layer 202 contains Mg which is a constituent element of $ScAlMgO_4$ substrate 201; however, when a different type of $RAMO_4$ substrate is used as a seed substrate, p-type group III nitride crystal layer 102 of a Group III nitride semiconductor obtained ultimately preferably contains element M in the general formula $RAMO_4$, that is, Mg, Mn, Fe(II), Co, Cu, Zn or Cd, particularly preferably Mg or Zn. Accordingly, variations in height among a plurality of n-type Group III nitride crystal layers 103 can be suppressed.

Here, the concentration of atoms represented by M in the general formula, in p-type Group III nitride crystal layer 102, is preferably higher on the $RAMO_4$ substrate 101 side than on the n-type Group III nitride crystal layer 103 side. In particular, a region up to thickness of about 100 nm from an interface between $RAMO_4$ substrate 101 and p-type Group III nitride crystal layer 102 has a large number of dislocations occurring at the interface. When etching using PEC method proceeds to a portion having a larger number of dislocations, uniform nanowires cannot be formed because of, for example, thinning or elimination of the roots of nanowires (a plurality of n-type Group III nitride crystal layers 103). Therefore, it is preferable to adjust conductivity so that etching of the portion in the vicinity of the interface where a large number of dislocations exist is prevented by adding a larger amount of M atoms to turn the conductivity type into a p-type.

In the description above, a case where the p-type Group III nitride crystal layer is thinner than the n-type Group III nitride crystal layer is taken as an example. There may be cases where the p-type Group III nitride crystal layer is thicker than the n-type Group III nitride crystal layer.

Further, in the above-described method, in order to thoroughly diffuse constituent element M of $RAMO_4$ substrate 101 which is a seed substrate from the substrate into p-type Group III nitride crystal layer 102, the MOCVD method described above may be carried out. More specifically, by carrying out the MOCVD method at temperature of 950° C. or higher and 1,150° C. or lower (at pressure of 0.1 atm or more and 1.6 atm or less), constituent element M of $RAMO_4$ substrate 101 can be thermally diffused into p-type Group III nitride crystal layer 102.

Further, in the description of n-type GaN nanowire layer 204 which is one example of n-type Group III nitride crystal layer 103, Si is used as a dopant;however, another n-type dopant may be used. Examples thereof may include Ge and O.

Further, in the above description, GaN nanowires and the like are formed on a $ScAlMgO_4$ substrate; however, AlN nanowires, $Al_xGa_{1-x}N$ ($0 \leq x \leq 1$) nanowires or the like may be formed by similarly growing a layer of another Group III nitride, for example an AlN layer using MOCVD method. When such nanowires are used, it is also possible, for example, to reduce defects in a Group III nitride crystal of a GaN layer, an $Al_yGa_{1-y}N$ ($0 \leq y \leq 1$) or the like which is formed on the nanowires. That is, a high-quality Group III nitride crystal can be similarly obtained. When AlN nanowires are formed, it is preferable to use a light source such as a low-pressure mercury lamp or the like that is capable of emitting light having a wavelength shorter than the bandgap (wavelength: about 200 nm) of AlN. Further, as in the case of GaN, a mixture of KOH and $K_2S_2O_8$ can be used as an etchant in the PEC method, and the concentration and the etching time are appropriately adjusted according to the ultraviolet light intensity.

INDUSTRIAL APPLICABILITY

The present disclosure is applicable to high-quality GaN substrates for crystal growth for white LEDs and semiconductor laser diodes which are used for lightings and automotive headlights; power transistors for high-frequency and high-output uses which are used for electric vehicles; and the like.

REFERENCE SIGNS LIST

101 $RAMO_4$ ($ScAlMgO_4$) substrate
102 p-type Group III nitride crystal layer
103 n-type Group III nitride crystal layer
104 Group III nitride crystal layer
201 $RAMO_4$ ($ScAlMgO_4$) substrate
202 p-type GaN layer
203 n-type GaN layer
204 n-type GaN nanowire layer
205 GaN layer
206 Cleavage position

The invention claimed is:

1. A Group III nitride semiconductor, comprising:
   an $RAMO_4$ substrate including a single crystal represented by the general formula $RAMO_4$ (where R represents one or more trivalent elements selected from the group consisting of Sc, In, Y and lanthanoid elements, A represents one or more trivalent elements selected from the group consisting of Fe(III), Ga and Al, and M represents one or more divalent elements selected from the group consisting of Mg, Mn, Fe(II), Co, Cu, Zn and Cd);
   a p-type Group III nitride crystal layer disposed on the $RAMO_4$ substrate;
   a plurality of n-type Group III nitride crystal layers disposed on the p-type Group III nitride crystal layer and separated from one another; and
   a Group III nitride crystal layer disposed on the plurality of n-type Group III nitride crystal layers.

2. The Group III nitride semiconductor according to claim 1, wherein the p-type Group III nitride crystal layer contains an atom represented by M in the general formula.

3. The Group III nitride semiconductor according to claim 2, wherein the concentration of the atom represented by M in the general formula, in the p-type Group III nitride crystal layer, is higher on the $RAMO_4$ substrate side than on the n-type Group III nitride crystal layer side.

4. The Group III nitride semiconductor according to claim 3, wherein the atom represented by M in the general formula is Mg.

* * * * *